United States Patent
Um et al.

(10) Patent No.: US 8,212,951 B2
(45) Date of Patent: Jul. 3, 2012

(54) LIQUID CRYSTAL DISPLAY

(75) Inventors: Yoon-Sung Um, Yongin-si (KR); Su-Jeong Kim, Seoul (KR); Hye-Ran Yoo, Incheon (KR); Jae-Jin Lyu, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 248 days.

(21) Appl. No.: 12/422,852

(22) Filed: Apr. 13, 2009

(65) Prior Publication Data
US 2010/0079695 A1 Apr. 1, 2010

(30) Foreign Application Priority Data
Sep. 26, 2008 (KR) .................. 10-2008-0094629

(51) Int. Cl.
G02F 1/1343 (2006.01)
(52) U.S. Cl. .............. 349/39; 349/38; 349/43; 349/47
(58) Field of Classification Search ............ 349/38, 349/39, 43, 47
See application file for complete search history.

(56) References Cited

U.S. PATENT DOCUMENTS

| | | | |
|---|---|---|---|
| 6,285,418 B1* | 9/2001 | Ko et al. | 349/38 |
| 7,271,856 B2* | 9/2007 | Kim et al. | 349/43 |
| 7,349,036 B2* | 3/2008 | Hong | 349/39 |
| 7,843,539 B2* | 11/2010 | Kim et al. | 349/139 |
| 2004/0125259 A1* | 7/2004 | Cho | 349/43 |
| 2005/0077516 A1* | 4/2005 | Lim et al. | 257/59 |
| 2005/0270445 A1* | 12/2005 | Lee et al. | 349/108 |
| 2006/0125989 A1* | 6/2006 | Park et al. | 349/141 |
| 2006/0227276 A1* | 10/2006 | Son | 349/141 |
| 2006/0290867 A1* | 12/2006 | Ahn et al. | 349/141 |
| 2007/0164331 A1* | 7/2007 | Aiin et al. | 257/291 |
| 2007/0187689 A1* | 8/2007 | Oh et al. | 257/72 |
| 2007/0206125 A1* | 9/2007 | Lee | 349/38 |
| 2008/0024709 A1* | 1/2008 | Moon | 349/139 |
| 2008/0055504 A1* | 3/2008 | Choi et al. | 349/38 |
| 2008/0094530 A1* | 4/2008 | Ina et al. | 349/39 |
| 2008/0117349 A1* | 5/2008 | Chang et al. | 349/55 |

* cited by examiner

Primary Examiner — Edward Glick
Assistant Examiner — Sang Nguyen
(74) Attorney, Agent, or Firm — Innovation Counsel LLP

(57) ABSTRACT

A liquid crystal display includes, for an embodiment, a first insulation substrate; a gate line extending in a first direction on the first insulation substrate; a data line insulated from the gate line and extending in a second direction; a pixel electrode formed in a pixel area defined by the intersection of the gate line and the data line; and storage wiring formed with the same layer as the data line, wherein the storage wiring includes a storage electrode extending in the first direction and covering the gate line, and a storage line connected to the storage electrode and formed according to the second direction.

18 Claims, 4 Drawing Sheets

LIQUID CRYSTAL DISPLAY

CROSS-REFERENCE TO RELATED APPLICATIONS

This application claims priority to and the benefit of Korean Patent Application No. 10-2008-0094629 filed in the Korean Intellectual Property Office on Sep. 26, 2008, the entire contents of which are herein incorporated by reference.

BACKGROUND

1. Technical Field

The present invention relates to liquid crystal displays and, more particularly, to a liquid crystal display having a transverse pixel structure.

2. Related Art

Typically, a liquid crystal display includes a common electrode panel having a common electrode and a thin film transistor array panel having a thin film transistor array. The common electrode panel and the thin film transistor array panel face each other and are combined by a sealing line interposed between the two display panels, with a liquid crystal layer formed in the space between the two display panels. This liquid crystal display including the two panels is provided with field-generating electrodes, between which the liquid crystal layer is interposed. This liquid crystal display displays images by applying voltages to the field-generating electrodes to generate an electric field in the liquid crystal layer that determines the orientations of liquid crystal molecules therein to control the amount of transmitted light. The liquid crystal display is a non-emissive device such that a backlight unit for providing the light on the rear of the thin film transistor array panel is provided. The amount of transmittance of light that is irradiated by a backlight is controlled according to the arrangement of the liquid crystal molecules.

The thin film transistor array panel includes a plurality of gate lines, data lines, and pixel electrodes. The gate lines extend in the row direction and transmit gate signals, and the data lines extend in the column direction and transmit data signals. The pixel electrodes are connected to the gate lines and the data lines, and to a plurality of switching elements and storage capacitors.

The switching elements are disposed at portions where the gate lines and the data lines intersect each other, and each switching element is a three terminal element including a control terminal connected to a gate line, an input terminal connected to a data line, and an output terminal connected to a pixel electrode.

In the case of a conventional liquid crystal display, light leakage is generated on the circumference of the data lines according to the space between the data lines and the pixel electrodes. To prevent the light leakage, a black matrix is extended on the common electrode panel. Such a device may result, however, in an aperture ratio of the entire liquid crystal display being reduced.

To solve this problem, a panel may be formed in which storage wiring for preventing the light leakage is formed under the data lines, and the pixel electrodes overlap the storage wiring to which the common signal is applied. In this panel, however, the data load is increased so that problems such as high heat and driving deterioration of the high voltage are generated.

Thus, there is a need for a liquid crystal display that prevents light leakage without reducing the aperture ratio of the display. There is also a need for a liquid crystal display that prevents a reduction of aperture ratio without increasing the data load.

The above information disclosed in this Background section is only for enhancement of understanding of the background of the invention and therefore it may contain information that does not form the prior art that is already known in this country to a person of ordinary skill in the art.

SUMMARY

One or more embodiments of the present invention may prevent a reduction of aperture ratio without increasing a data load. For example, in one embodiment, a liquid crystal display includes: a first insulation substrate; a gate line extending in a first direction on the first insulation substrate; a data line insulated from the gate line and extending in a second direction; a pixel electrode formed in a pixel area defined by the intersection of the gate line and the data line; and storage wiring formed with the same layer as the data line, wherein the storage wiring includes a storage electrode extending in the first direction and covering the gate line, and a storage line connected to the storage electrode and formed according to the second direction.

The pixel area may have a longer length in the first direction than the second direction. The storage electrode may be wider than the gate line. The width of the storage electrode deviated from the gate line may be in the range of 1 μm (micrometer or micron) to 10 μm. The storage electrode may overlap the edge of the pixel electrode. The storage electrode may simultaneously overlap a pair of neighboring pixel electrodes with regard to the center of the gate line. The storage wiring may include a protrusion that is not overlapped with the pixel electrode.

The liquid crystal display may further include a bridge that is electrically connected to a pair of storage wires with regard to the center of the data line, and the bridge may be contacted with the protrusion of one of the pair of storage wires and the storage electrode of the other of the pair of storage wires. The bridge may be formed with the same material as the pixel electrode and is made of the same layer as the pixel electrode. The bridge may be made of ITO or IZO.

The storage line may overlap the edge of the second direction of the pixel electrode. The liquid crystal display may further include an assistance light blocking member overlapping the edge opposite to the edge overlapping the storage line among the edges of the second direction of the pixel electrode. The assistance light blocking member may be made of the same material and layer as the gate line.

The liquid crystal display may further include a second insulation substrate facing the first insulation substrate and a black matrix formed on the second insulation substrate and defining the pixel area, and the width of the storage electrode may be the same as the width of the black matrix.

The liquid crystal display may further include a thin film transistor including a source electrode, a drain electrode, and a semiconductor layer, and the semiconductor layer may be formed of an oxide semiconductor or a low temperature polysilicon. The oxide semiconductor may be made of a composition including two components such as Zn—O, In—O, Sn—O, Ga—O, Hf—O, Mg—O, and Cd—O, or a composition made of a combination thereof.

According to one embodiment of the present invention, a transverse pixel structure may be applied such that the width of the black matrix is reduced, thereby improving the aperture ratio. Also, the storage wire may be formed with the same layer as the data line, and the storage wire and the pixel electrode may overlap each other in the edge region of the pixel electrode of the transverse pixel structure to form a storage capacitor such that the storage capacitance is increased with the same area compared with the conventional art. Also, the storage electrode may cover the gate line, thereby preventing a gate field.

DETAILED DESCRIPTION

Figure 1:
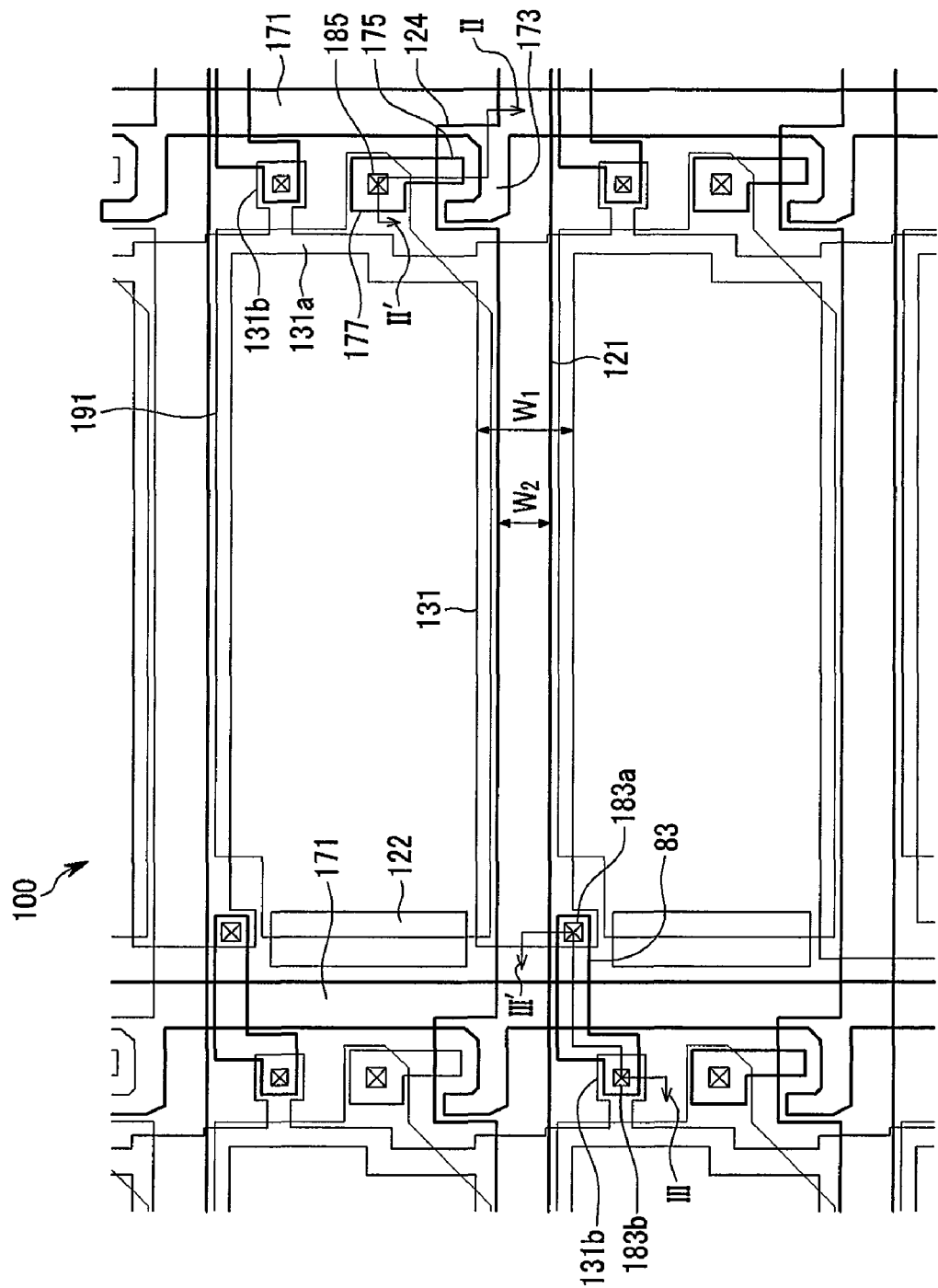
FIG. 1 is a layout view of a thin film transistor array panel according to an embodiment of the present invention.

Exemplary embodiments of the present invention will be described in detail with reference to the accompanying drawings. However, the present invention is not limited to exemplary embodiments described herein, but may be embodied in other forms. Rather, exemplary embodiments described herein are provided to thoroughly and completely explain the disclosed contents and to sufficiently transfer the ideas of the present invention to a person of ordinary skill in the art.

In the drawings, the thickness of layers and regions is exaggerated for clarity. It is to be noted that when a layer is referred to as being "on" another layer or substrate, it can be directly formed on another layer or substrate or can be formed on another layer or substrate through a third layer interposed therebetween. Like constituent elements are denoted by like reference numerals throughout the specification.

Figure 2:
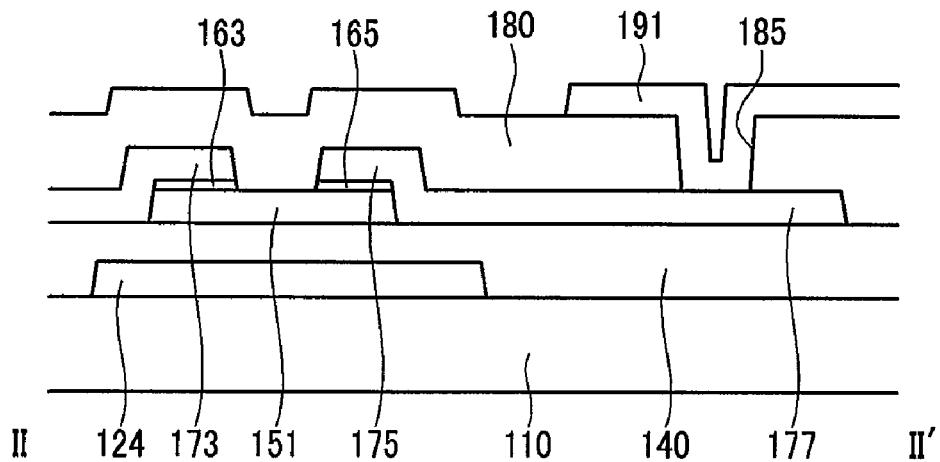
FIG. 2 is a cross-sectional view taken along the line II-II' of FIG. 1 in accordance with an embodiment of the present invention.
Figure 3:
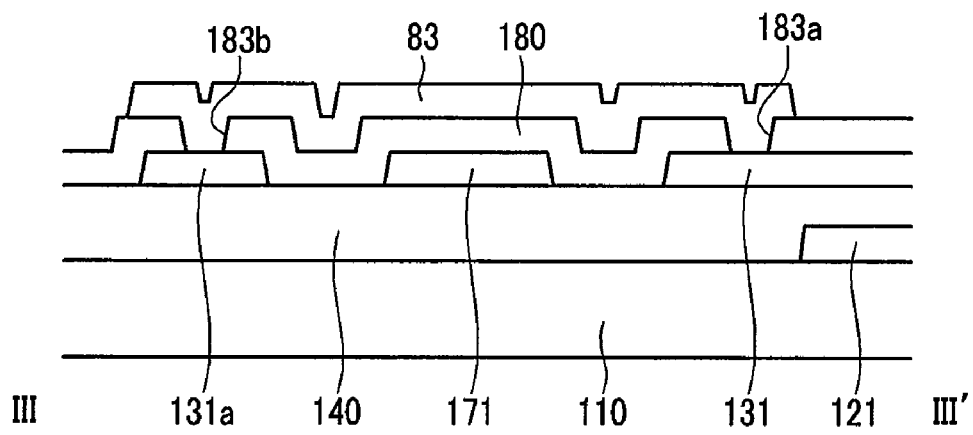
FIG. 3 is a cross-sectional view taken along the line III-III' of FIG. 1 in accordance with an embodiment of the present invention.

FIG. 1 is a layout view of a thin film transistor array panel included in a liquid crystal display according to an exemplary embodiment of the present invention. FIG. 2 is a cross-sectional view taken along the line II-II' of FIG. 1, and FIG. 3 is a cross-sectional view taken along the line III-III' of FIG. 1 in accordance with one or more embodiments.

A thin film transistor array panel according to an embodiment of the present invention will be described with reference to FIG. 1, FIG. 2, and FIG. 3.

A thin film transistor array panel 100 according to an embodiment of the present invention includes gate wiring (121 and 124) formed on a first insulation substrate 110, an assistance light blocking member 122, storage wiring (131, 131a, and 131b), a gate insulating layer 140, a semiconductor layer 151, ohmic contact layers 163 and 165, data wiring (171, 173, and 177), a passivation layer 180, and a pixel electrode 191.

The first insulation substrate 110 may be made of a material having heat resistance and light transmittance such as transparent glass or plastic.

The gate wiring (121 and 124) extending in a first direction is formed on the first insulation substrate 110. The gate wiring (121 and 124) extends in the first direction, for example the transverse direction, and includes a gate line 121 transmitting gate signals and a gate electrode 124 protruding from the gate line 121 as a protrusion. The gate electrode 124 is one of three terminals of the thin film transistor along with a source electrode 173 and a drain electrode 175 that are will be described later. The gate wiring (121 and 124) may be made of a metal having low resistance such as an aluminum-based metal of aluminum (Al) or aluminum alloys, a silver-based metal of silver (Ag) or silver alloys, and a copper-based metal of copper (Cu) or copper alloys. However, they may have a multilayered structure including two conductive layers (not shown) having different physical properties, and they may be made of various other metals or electrical conductors.

The gate insulating layer 140 covering the gate wiring (121 and 124) is formed on the first insulation substrate 110. The gate insulating layer 140 may be made of silicon oxide (SiOx) or silicon nitride (SiNx).

The semiconductor layer 151 that is made of hydrogenated amorphous silicon, polysilicon, or a conductive organic material is formed on the gate insulating layer 140. However, in an exemplary embodiment of the present invention, it is preferable that the semiconductor layer 151 is made of an oxide semiconductor or a low temperature polysilicon (LTPS) to improve the mobility of the current.

Here, the oxide semiconductor has mobility of several times or several tens of times compared with the hydrogenated amorphous silicon. The oxide semiconductor may be made of one composition including a two-component group such as In—O, Sn—O, Ga—O, Hf—O, Mg—O, Cd—O, and Zn—O, or may be a composition made of a combination thereof. For example, it may be an amorphous oxide semiconductor (a-IGZO) based on zinc oxide (ZnO), InGaO$_3$(ZnO)$_5$, magnesium zinc oxide (Mg$_x$Zn$_{1-x}$O), cadmium zinc oxide (Cd$_x$Zn$_{1-x}$O), cadmium oxide (CdO), or In—Ga—Zn—O. It is possible that the oxide semiconductor exists in an amorphous state, a crystalline state, or a micro-crystalline state in which an amorphous state and a crystalline state coexist.

The LTPS is formed by a technique in which thin film transistors are formed on a glass substrate at a temperature of less than 600 degrees with a laser, thereby forming a thin film transistor liquid crystal display with a large size, as with the conventional amorphous silicon (a-Si). When the semiconductor layer 151 is formed of the oxide semiconductor and has the LTPS applied to it, high speed driving may be realized through the excellent electrical characteristics obtained.

The semiconductor layer 151 may have various shapes such as an island shape or a stripe shape, and for example, when the semiconductor layer 151 is formed with an island shape as in an embodiment of the present invention, the semiconductor layer 151 may overlap the gate electrode 124 and partially overlap the source electrode 173 and the drain electrode 175 that will be described. The semiconductor layer 151 is not limited by the island shape and may be variously formed.

The ohmic contact layers 163 and 165 that are made of a material such as silicide, n+ hydrogenated amorphous silicon doped with an n-type impurity at a high concentration, or ITO doped with a p-type impurity, are formed on the semiconductor layer 151. The ohmic contact layers 163 and 165 are disposed as a pair on the semiconductor layer 151, and improve the contact characteristic between the source electrode 173 and drain electrode 175 and the semiconductor layer 151. When the contact characteristic between the source electrode 173 and drain electrode 175 and the semiconductor layer 151 is sufficient, the ohmic contact layers 163 and 165 may be omitted.

The data wiring (171, 173, and 177) is formed on the semiconductor layer 151 and the gate insulating layer 140. The data wiring (171, 173, and 177) includes a data line 171 extending in the second direction (the longitudinal direction)

and transmitting a data signal, the source electrode 173 branched from the data line 171 and extending on the semiconductor layer 151, and the drain electrode 175 separated from the source electrode 173 and facing the source electrode 173. The data line 171 is insulated from and intersects the gate line 121, thereby defining a pixel area.

The source electrode 173 branched from the data line may have a "J" shape, and overlaps a portion of the semiconductor layer 151.

One end of the drain electrode 175 is close to the concave portion of the source electrode 173 with the "J" shape, and at least overlaps the portion of the semiconductor layer 151.

On the other hand, an expansion 177 extended from one end of the drain electrode 175 is electrically connected to the pixel electrode 191 and has a wider width than the drain electrode 175. The expansion 177 of the drain electrode 175 may be formed outside of the pixel area in order not to reduce the aperture ratio. Here, the pixel area is a region defined by the gate wiring (121 and 124) and the data wiring (171, 173, and 177). The pixel area is a region where the light emitted from the backlight assembly passes through. Accordingly, a color filter region of a color filter panel corresponding to the pixel area of the thin film transistor array panel 100 is the pixel area.

It is preferable that the pixel area in an embodiment of the present invention is formed to have a longer length in the first direction (e.g., direction of the gate line 121) of the pixel area than in the second direction (e.g., direction of the data line 171).

The data wiring (171, 173, and 177) may be made of a metal such as chromium and molybdenum, or a refractory metal such as tantalum and titanium, and may have a multi-layered structure including a lower layer (not shown) of a refractory metal and an upper layer (not shown) of a low resistance material. Also, like the gate wiring (121 and 124), the data wiring (171, 173, and 177) may be made of a metal having low resistance such as an aluminum-based metal of aluminum (Al) or aluminum alloys, a silver-based metal of silver (Ag) or silver alloys, and a copper-based metal of copper (Cu) or copper alloys.

The gate electrode 124, the source electrode 173, and the drain electrode 175 form a thin film transistor along with the semiconductor layer 151, and the channel of the thin film transistor is formed in the semiconductor layer 151 between the source electrode 173 and the drain electrode 175.

A passivation layer 180 is formed on the data wiring (171, 173, and 175) and the storage wiring (131, 131a and 131b), and the exposed semiconductor layer 151. The passivation layer 180 may be made of an inorganic insulator or an organic insulator, and may have a flat surface. The organic insulator may have a dielectric constant less than 4.0, and photosensitivity.

The storage wiring (131, 131a, and 131b) is formed with the same layer as the data wiring (171, 173, and 177). The storage wiring (131, 131a, and 131b) includes a storage electrode 131 covering the gate line 121, and the storage electrode 131 is formed in the same direction as the first direction of the gate line 121.

The storage electrode 131 simultaneously overlaps a pair of neighboring pixel electrodes 191 with regard to the gate line 121. The width W1 of the storage electrode 131 is wider than the width W2 of the gate line 121.

The storage electrode 131 is disposed on the gate line 121, thereby having a light blocking function. Also, a storage capacitor is formed between the storage electrode 131 of the storage wiring with the same layer as the data line 171, the passivation layer 180, and the pixel electrode 191 such that the interval between the electrodes (e.g., storage electrode 131 and pixel electrode 191) is reduced compared with the case in which the storage wiring is formed with the same layer as the gate line (i.e., further from the pixel electrode), and thereby a larger storage capacitance may be formed with the same area. Further, the data line 171 and the storage wiring (131, 131a, and 131b) do not overlap each other, and thus, the data load is reduced, thereby reducing the power consumption. As a substitute, the gate load is increased, as described above. The semiconductor layer 151, however, may be formed of the oxide semiconductor or applied with the low temperature polysilicon (LTPS) such that the mobility is improved, and thereby problems due to increasing the gate load may be ameliorated or avoided.

The storage wiring (131, 131a, and 131b) may be made of the same material as the data wiring (171, 173, and 175).

The storage wiring (131, 131a and 131b) includes a storage line 131a connected to the storage electrode 131 and extending according to the second direction. The storage line 131a is separated from the data line 171 and arranged parallel to the data line 171. The storage line 131a is disposed to overlap the edge of the pixel electrode 191 in the second direction such that the storage capacitor may be formed between the pixel electrode 191 and the storage line 131a.

At least a portion of the storage line 131a does not overlap the pixel electrode 191. In detail, the storage line 131a is wholly parallel to the data line 171, however a portion of the storage line 131a forms a protrusion 131b protruded outside of the pixel electrode 191 such that the protrusion 131b does not overlap the pixel electrode 191. The protrusion 131b is protruded toward the data line 171 close to the storage line 131a, and does not overlap the gate wiring (121 and 124) and the data wiring (171, 173, and 177). The shape of the protrusion 131b may be like a "⊏" shape, however if it does not overlap the pixel electrode 191, may be changed such as to a circular arc shape, a " ⋏ " shape.

An assistance light blocking member 122 is formed overlapping the edge of the pixel electrode 191 opposite to the edge of the pixel electrode 191 overlapping the storage line 131a and along the edge of the pixel electrode 191 in the second direction. The assistance light blocking member 122 is made of the same material as the gate line 121, and is disposed with the same layer as the gate line 121. The assistance light blocking member 122 has a function of blocking light leakage generated between the data line 171 and the pixel electrode 191.

The passivation layer 180 has a plurality of contact holes 183a, 183b, and 185 exposing the wide end portion 177 of the drain electrode 175 and the storage wiring (131, 131a, and 131b). The pixel electrode 191 and a bridge 83 are formed on the passivation layer 180. They may be made of a transparent conductive material such as indium tin oxide (ITO) or indium zinc oxide (IZO), or a reflective metal such as aluminum, silver, chromium, or alloys thereof.

The pixel electrode 191 is physically and electrically connected to the drain electrode 175 through the contact hole 185, and receives data voltages from the drain electrode 175.

In the liquid crystal display according to the present invention, the bridge 83 electrically connects neighboring storage wiring (131, 131a, and 131b). In detail, the bridge 83 is connected to one storage line 131a among the storage wiring (131, 131a, and 131b) and to a storage electrode 131 among another, second storage wiring (131, 131a, and 131b). The bridge 83 is electrically connected to the protrusion 131b of the storage line 131a of the storage electrodes 131 through the contact holes 183a and 183b.

A bridge 83 may be formed at every pixel area. In other words, the bridge 83 may be all formed at all pixel areas that are defined as a red pixel area, a green pixel area, or a blue pixel area according to a corresponding color filter 230 that win be described later. A pixel electrode 191 of a pixel area having a bridge 83 may have a smaller area than a pixel electrode of a pixel area without a bridge 83. That is, a corner portion of a pixel electrode 191 is cut out from the pixel electrode 191 to form a bridge 83 such the pixel electrode 191 of the pixel area having the bridge 83 is electrically separated from the bridge 83.

The bridge 83 may be formed in all pixel areas, or it may be formed in two pixel areas among the above-described pixel areas or it may be formed in one pixel area. One pixel area may be a blue pixel area in which the luminance is lowest. When the bridge 83 is formed at every blue pixel area in which the luminance is lowest, a reduction of luminance according to the formation of the bridge 83 may be minimized, and a spacer of the color filter panel that will be described later is formed on a portion corresponding to the bridge 83 such that the reduction of the aperture ratio due to the spacer may be prevented.

Figure 4:
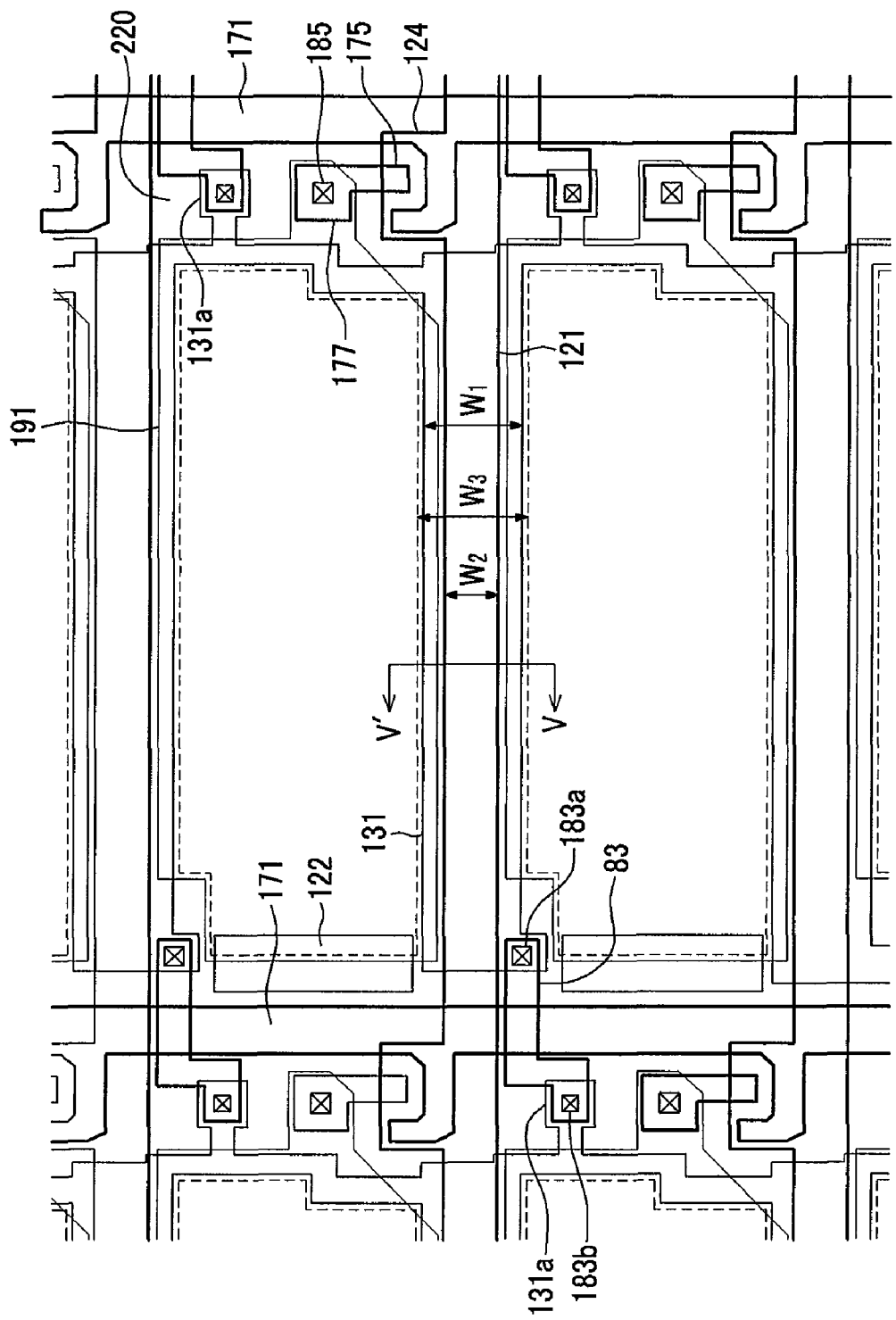
FIG. 4 is a layout view of a liquid crystal display according to an embodiment of the present invention.
Figure 5:
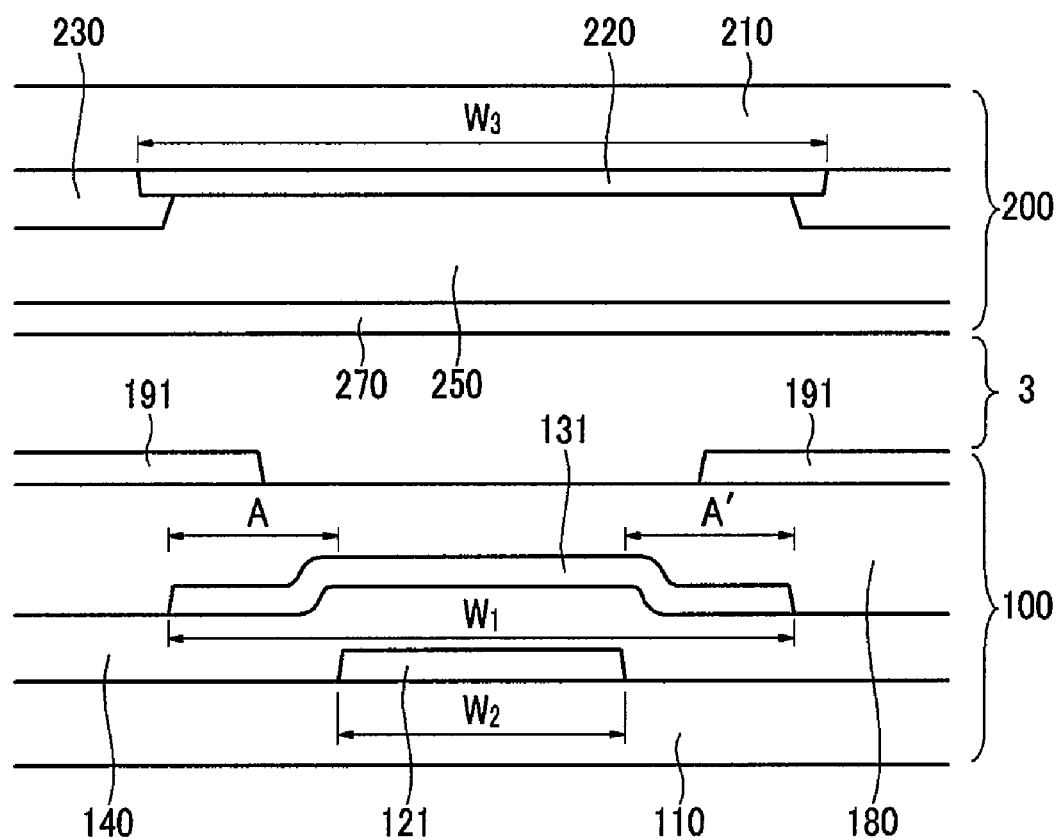
FIG. 5 is a cross-sectional view taken along the line V-V' of FIG. 4 in accordance with an embodiment of the present invention.

FIG. 4 is a layout view of a liquid crystal display according to an embodiment of the present invention. FIG. 5 is a cross-sectional view taken along the line V-V' of FIG. 4 in accordance with an embodiment.

Referring to FIG. 4 and FIG. 5, the pixel electrodes 191, having the data voltages applied, and a common electrode 270 of the color filter panel 200 generate an electric field that determines the orientations of liquid crystal molecules of a liquid crystal layer 3 (see FIG. 5) between two electrodes 191 and 270.

A color filter panel 200 includes a black matrix 220, the color filter 230, an overcoat 250, and the common electrode 270, which are formed on the lower surface of a second insulation substrate 210, and is disposed to be opposite to the thin film transistor array panel 100.

The second insulation substrate 210 of the color filter panel 200 may be made of a material having thermal resistance and light transmittance, such as glass or plastic.

The black matrix 220 blocks light leakage between the pixel electrodes 191 and defines an opening facing each pixel electrode 191. The black matrix 220 is formed of an opaque material such as chromium (Cr), and defines the pixel area in a matrix shape in the first direction and the second direction. A width W3 of the first direction, for example the transverse direction, may be formed with the same width W1 of the storage electrode 131 of the storage wiring, and thereby the aperture ratio is not decreased.

It is preferable that widths A and A' of the storage electrode 131 away from the gate line 121 are in the range of 1 μm (micrometer or micron) to 10 μm. If the widths A and A' are excessively small, the effect of blocking a gate field is reduced, and if the widths A and A' are excessively large, the aperture ratio may be decreased.

The effect according to an embodiment of the present invention will now be described in detail.

When storage wiring is formed with the same layer as the gate line and overlaps data line thereunder under the longitudinal pixel structure, a margin for preventing light leakage by the lateral electric field between the data line and the pixel electrode is required and the width of the black matrix is about 19.5 μm.

When the liquid crystal display according to an embodiment of the present invention is a normally black mode display, the voltage of the storage electrode 131 and the pixel voltage of the black state are equal such that light leakage between the storage electrode 131 and the pixel electrode 191 is not generated (it is assumed that the voltage of the storage electrode is 0 V), and accordingly the aperture ratio is improved. Here, the normally black mode is a mode in which the incident light is totally blocked by the liquid crystal panel in a state in which the application voltage does not exist such that the luminance is lowest, and the application voltage is over a threshold voltage such that the light is transmitted.

Again referring to FIG. 4 and FIG. 5, if the widths A and A' of the storage electrode 131 away from the gate line 121 is defined as a first interval, the first interval is a margin required for the function of preventing the gate field. Generally, the first interval (A and A') is in the range of 2.0 μm to 3.5 μm. If the width W2 of the gate line 121 is 7 μm, the entire width W1 of the storage electrode 131 is in the range of 12 μm to 14 μm such that the width W3 of the black matrix may be reduced compared with the conventional 19.5 μm. In the case of the transverse pixel structure, the danger of color mixture does not exist so that it is possible to reduce the width W3 of the black matrix.

When the liquid crystal display according to an embodiment of the present invention is a normally white mode display, a lateral electric field is generated between the storage electrode 131 and the pixel electrode 191 in the black state such that light leakage is generated between the storage electrode 131 and the pixel electrode 191. Here, the normally white mode means a mode in which the light is transmitted in the state in which the voltage is not applied, thereby obtaining maximum luminance, contrary to the normally black mode.

If it is assumed that in the conventional case driving occurs at 4.0 V, the application voltage of the source/drain is in the range of AC +4.0 to −4.0 V. In the black state in dot inversion, a potential difference between the data line and the pixel electrode is in the range of 0 to 8.0 V as the lateral electric field under the pixel voltage of +4.0 V, and a root mean square (RMS) may be 4.0 V. In detail, a distortion amount of the liquid crystal director is larger than the case in which the 4.0 V value is uniformly maintained. In contrast, in the liquid crystal display according to an embodiment of the present invention, the application voltage of the storage wiring (131, 131a and 131b) is DC 0 V such that a voltage difference between the pixel voltage and the storage voltage is always 4.0 V under positive inversion and negative inversion. Accordingly, the distortion amount of the liquid crystal director is smaller than the conventional such that it is possible to reduce the width W3 of the black matrix.

A plurality of color filters 230 are formed on the second insulation substrate 210 and the black matrix 220. The color filters 230 are mainly disposed in the regions enclosed by the black matrix 220, and may extend according to the column of the pixel electrodes 191. Each of color filters 230 may display one of primary colors such as three primary colors of red, green, and blue.

An overcoat 250 is formed on the color filters 230 and the black matrix 220. The overcoat 250 may be made of an (organic) insulating material, and it prevents the color filters 230 from being exposed and provides a plane surface.

A common electrode 270 is formed on the overcoat 250. The common electrode 270 is made of the transparent conductor such as ITO or IZO, and is applied with a common voltage Vcom.

Alignment layers (not shown) are coated on the first and second insulation substrates 110 and 210, and they may be vertical alignment layers.

Polarizers (not shown) may be provided on the first and second insulation substrates 110 and 210, the transmissive axes of the two polarizers are crossed, and one transmissive axis may be parallel to the gate lines 121.

The liquid crystal layer 3 (see FIG. 5) between the thin film transistor array panel 100 and the color filter panel 200 may include liquid crystal molecules having negative dielectric anisotropy, and the liquid crystal molecules may be aligned such that their major axes are perpendicular to the surfaces of the two panels 100 and 200 in the absence of an electric field.

Also, although not shown, spacers for maintaining a uniform interval along the thin film transistor array panel 100 may be formed on the pixel electrodes 191, and the liquid crystal layer 3 may be interposed in the interval maintained by the spacers.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Thus, numerous modifications and variations are possible in accordance with the principles of the present disclosure. Accordingly, the scope of the disclosure is defined only by the following claims.

What is claimed is:

1. A liquid crystal display comprising:
a first insulation substrate;
a gate line extending in a first direction on the first insulation substrate;
a data line insulated from the gate line and extending in a second direction;
a first pixel electrode and a second pixel electrode respectively disposed in a pixel area; and
a first storage wiring formed at a same layer as the data line, wherein the first storage wiring includes a storage electrode extending in the first direction and covering the gate line, and a storage line connected to the storage electrode and formed according to the second direction,
wherein the first pixel electrode and the second pixel electrode are adjacent to each other with respect to the gate line,
wherein the storage electrode overlaps an edge of the first pixel electrode and an edge of the second pixel electrode simultaneously,
wherein the storage electrode overlaps a first separated portion between the edge of the first pixel electrode and the gate line and a second separated portion between the edge of the second pixel electrode and the gate line, and
wherein the first pixel electrode and the second pixel electrode extend in the first direction.

2. The liquid crystal display of claim 1, wherein the pixel area is defined by at least an intersection of the gate line and the data line, and
the pixel area has a longer length in the first direction than the second direction.

3. The liquid crystal display of claim 2, wherein
the storage electrode is wider than the gate line.

4. The liquid crystal display of claim 3, wherein
the width of the storage electrode deviated from the gate line is in a range of 1 μm to 10 μm.

5. The liquid crystal display claim 3, wherein
the first storage wiring includes a protrusion that is not overlapped with the first pixel electrode, the protrusion protruding in the first direction from the storage line toward the data line.

6. The liquid crystal display of claim 5, further comprising:
a second storage wiring for reducing light leakage; and
a bridge overlapping the data line and electrically connecting the first storage wiring to the second storage wiring, wherein the bridge contacts the protrusion of the first storage wiring and a second storage wiring.

7. The liquid crystal display of claim 6, wherein
the bridge is formed of a same material as the first pixel electrode and is disposed at a same layer as the first pixel electrode.

8. The liquid crystal display of claim 7, wherein
the bridge is made of ITO or IZO.

9. The liquid crystal display of claim 1, wherein
the storage line overlaps a first edge of the first pixel electrode, the first edge being disposed along the second direction.

10. The liquid crystal display of claim 9, further comprising
an assistance light blocking member overlapping a second edge of the first pixel electrode, the second edge of the first pixel electrode being disposed opposite to the first edge of the first pixel electrode, the second edge of the first pixel electrode being disposed along.

11. The liquid crystal display of claim 10, wherein
the assistance light blocking member is formed of a same material as the gate line and is disposed at a same layer as the gate line.

12. The liquid crystal display of claim 1, further comprising:
a second insulation substrate facing the first insulation substrate; and
a black matrix formed on the second insulation substrate and defining the pixel area,
wherein the width of the storage electrode is the same as the width of the black matrix.

13. The liquid crystal display of claim 1, further comprising
a thin film transistor including a source electrode, a drain electrode, and a semiconductor layer, and the semiconductor layer is formed of an oxide semiconductor or a polysilicon.

14. The liquid crystal display of claim 13, wherein the oxide semiconductor is made of a composition including at least one of Zn—O, In—O, Sn—O, Ga—O, Hf—O, a Mg—O, and a Cd—O.

15. The liquid crystal display of claim 1, further comprising:
a second insulation substrate facing the first insulation substrate; and
a common electrode disposed on the second insulation substrate.

16. The liquid crystal display of claim 1, wherein the first pixel electrode does not overlap the gate line, and wherein the first separated portion is disposed under the first pixel electrode and above the gate line in a top view of the liquid crystal display.

17. The liquid crystal display of claim 1, wherein the storage electrode covers the first separated portion, the second separated portion, and the gate line simultaneously.

18. A liquid crystal display comprising:
a first insulation substrate;
a gate line extending in a first direction on the first insulation substrate;
a data line insulated from the gate line and extending in a second direction;
a first pixel electrode and a second pixel electrode respectively disposed in a pixel area;
a first storage wiring formed at a same layer as the data line, wherein the first storage wiring includes a storage electrode extending in the first direction and covering the gate line, and a storage line connected to the storage electrode and formed according to the second direction;

a first storage capacitor formed between the storage electrode and the first pixel electrode; and a second storage capacitor formed between the storage electrode and the second pixel electrode, wherein the first pixel electrode includes a first edge and a second edge, the first edge extending in the first direction, the second edge extending in the second direction and being shorter than the first edge, wherein the second pixel electrode includes a third edge and a fourth edge, the third edge extending in the first direction, the fourth edge extending in the second direction and being shorter than the third edge, and wherein the storage electrode overlaps the first edge and overlaps the third edge.

* * * * *